United States Patent
Nguyen

(10) Patent No.: US 7,241,342 B2
(45) Date of Patent: Jul. 10, 2007

(54) NON-DRIPPING NOZZLE APPARATUS

(75) Inventor: Andrew P. Nguyen, San Jose, CA (US)

(73) Assignee: ASML Holding N.V. (NL)

( * ) Notice: Subject to any disclaimer, the term of this patent is extended or adjusted under 35 U.S.C. 154(b) by 186 days.

(21) Appl. No.: 10/743,928

(22) Filed: Dec. 22, 2003

(65) Prior Publication Data

US 2005/0133075 A1 Jun. 23, 2005

(51) Int. Cl.
  *B05C 5/00* (2006.01)
  *B05C 13/02* (2006.01)
  *B05C 11/02* (2006.01)
(52) U.S. Cl. .................... 118/300; 118/305; 118/313; 118/52
(58) Field of Classification Search ................ 118/52, 118/612, 300, 305, 313, 302, 501, 323; 396/611, 396/627; 134/153, 198, 902, 88, 91; 222/478; 239/104, 106; 427/240
See application file for complete search history.

(56) References Cited

U.S. PATENT DOCUMENTS 5,405,443 A    4/1995  Akimoto et al.
5,435,885 A *  7/1995  Jones et al. ............... 216/92
5,962,070 A   10/1999  Mitsuhashi et al.
2002/0053319 A1* 5/2002 Nagamine .................. 118/52
2002/0121341 A1* 9/2002 Tanaka et al. ......... 156/345.21
2004/0222323 A1 11/2004 Akasaka et al.

FOREIGN PATENT DOCUMENTS

WO    WO 03/049868       6/2003
WO PCT/US2004/041202   10/2004

* cited by examiner

*Primary Examiner*—Yewebdar Tadesse
(74) *Attorney, Agent, or Firm*—Blakely, Sokoloff, Taylor & Zafman LLP

(57) ABSTRACT

According to one aspect of the invention, a dispense head for a wafer processing apparatus is provided. The dispense head may include an inlet, at least one outlet, a drain, and a passageway therethrough interconnecting the inlet, the outlet, and the drain. The inlet may be at a first height above a bottom of the passageway, the outlet may be at a second height above the bottom, and the drain may be at a third height above the bottom. A first valve may be connected to the inlet, and a second valve may be connected to the drain. When the first valve is opened and the second valve is closed, fluid flows into the inlet and out of the outlet. When the second valve is opened and the first valve is closed, fluid from the passageway flows out of the drain. A pump may be connected to the drain.

21 Claims, 9 Drawing Sheets

US 7,241,342 B2

NON-DRIPPING NOZZLE APPARATUS

BACKGROUND OF THE INVENTION

1). Field of the Invention

This invention relates to a semiconductor substrate processing apparatus and a method of processing a semiconductor substrate.

2). Discussion of Related Art

Integrated circuits are formed on semiconductor wafers. The formation of the integrated circuits may include numerous processing steps such as deposition of various layers, etching some of the layers, and multiple bakes.

Often the processing of semiconductor wafers takes place in large wafer processing machines. One of the components found in these machines are known as modules. These modules may receive a semiconductor wafer from a another component, place the wafer on a wafer support, and dispense a solution or solvent onto the wafer as one of the many steps included in wafer processing. The solution may be dispensed onto the wafers from a dispense head that is moved into a position over the wafer. Typically, the solution is fed into inlets of the dispense head through a valve and dispensed onto the wafer through nozzles on the dispense head.

After the solution is dispensed, unwanted solution often leaks or drips onto the wafer or another part of the module due to vibrations of the dispense head as it is moved, extra solution remaining in the dispense head, and air rising through the nozzles on the dispense head. This unwanted solution can damage the integrated circuits that are being formed and lead to increase maintenance costs of the wafer processing machine. One solution is to use a "suck-back" valve on the dispense head, which creates a vacuum back though the inlet causing excess solution to be drawn back through the inlet. However, the suck-back valves are expensive and are not completely effective as some solution still leaks from the dispense head.

SUMMARY OF THE INVENTION

The invention provides a dispense head for a semiconductor substrate, or wafer, processing apparatus. The dispense head may include an inlet, at least one outlet, a drain, and a passageway therethrough interconnecting the inlet, the outlet, and the drain. The inlet may be at a first height above a bottom of the passageway, the outlet may be at a second height above the bottom, and the drain may be at a third height above the bottom. A first valve may be connected to the inlet, and a second valve may be connected to the drain. When the first valve is opened and the second valve is closed, fluid flows into the inlet and out of the outlet. When the second valve is opened and the first valve is closed, fluid from the passageway flows out of the drain. A pump may be connected to the drain.

BRIEF DESCRIPTION OF THE DRAWINGS

The invention is described by way of example with reference to the accompanying drawings, wherein.

DETAILED DESCRIPTION OF THE INVENTION

FIG. 1 to FIG. 4f of the accompanying drawings illustrate a dispense head for a semiconductor substrate, or wafer, processing apparatus. The dispense head may include an inlet, at least one outlet, a drain, and a passageway therethrough interconnecting the inlet, the outlet, and the drain. The inlet may be at a first height above a bottom of the passageway, the outlet may be at a second height above the bottom, and the drain may be at a third height above the bottom. A first valve may be connected to the inlet, and a second valve may be connected to the drain. When the first valve is opened and the second valve is closed, fluid flows into the inlet and out of the outlet. When the second valve is opened and the first valve is closed, fluid from the passageway flows out of the drain. A pump may be connected to the drain.

Figure 1:
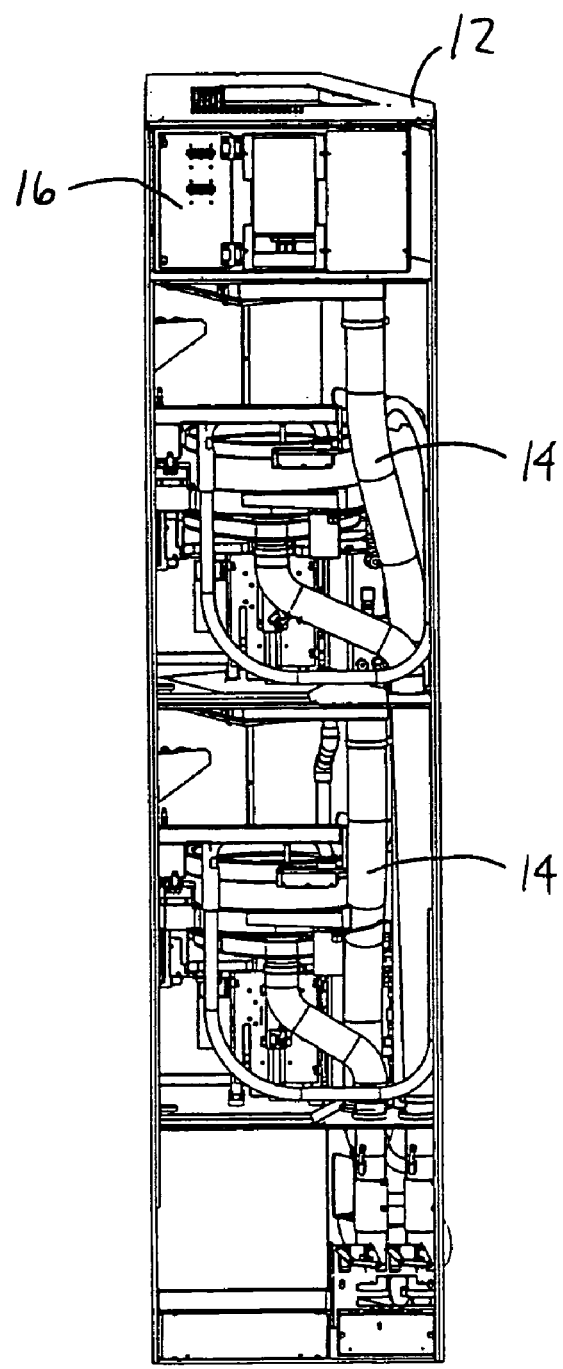
FIG. 1 is a cross-sectional side view of a module stack in a semiconductor wafer processing system, including developer modules and a computer controller.

FIG. 1 illustrates a module stack 10 from a semiconductor wafer processing system. In an embodiment, the module stack 10 may include a frame 12, developer modules 14, and a computer controller 16. The developer modules 14 may be vertically stacked and may be substantially identical. The computer controller 16 may lie on top of the developer modules 14 and although not shown in detail, may be electrically connected to the developer modules 14, and include a computer with a memory for storing a set of instructions and a processor connected to the memory for executing the instructions, as is commonly understood in the art.

Figure 2:
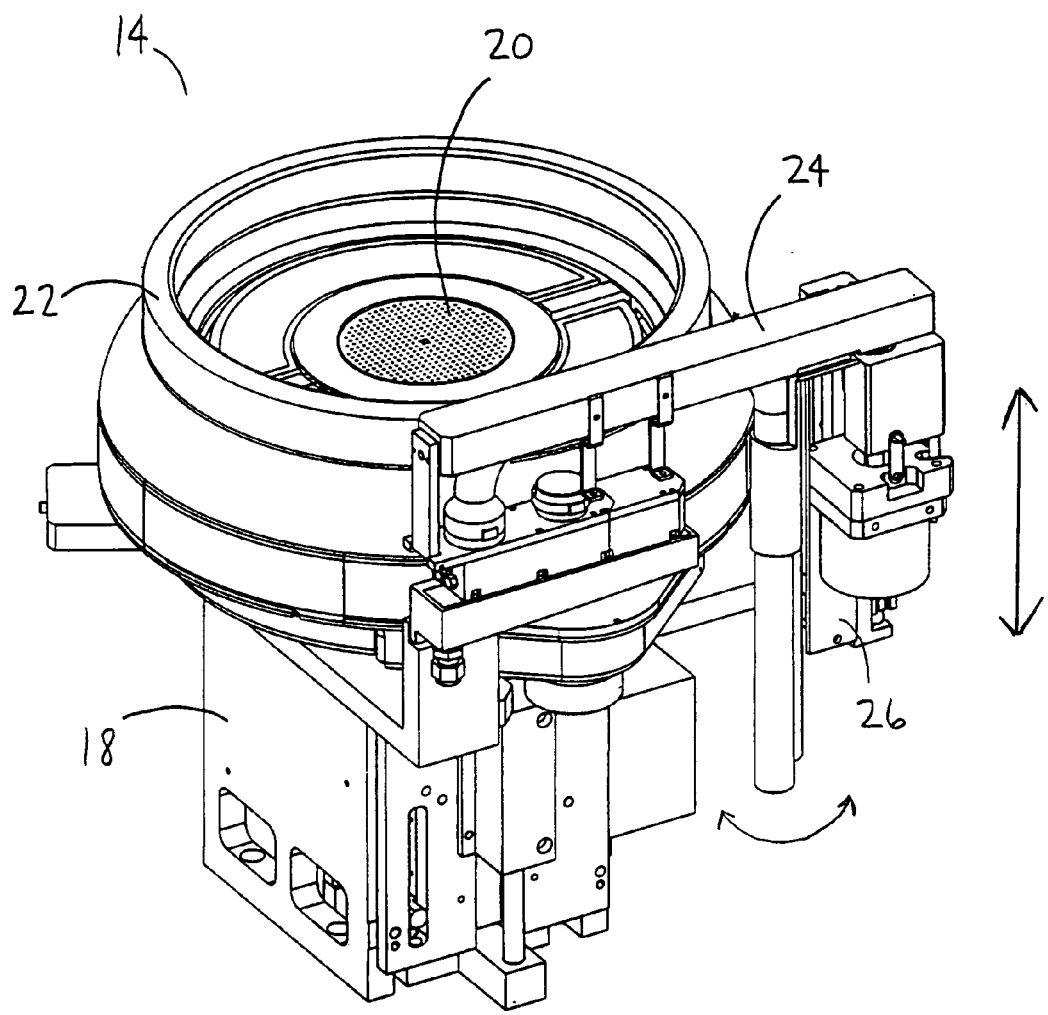
FIG. 2 is a perspective view of one of the developer modules of FIG. 1, including a dispense arm.

FIG. 2 illustrates one of the developer modules 14. The developer module 14 may include a base 18, a wafer chuck 20, a catch cup 22, and a dispense arm 24.

The base 18 may be attached to the frame 12 of the module stack 10 and be substantially cubic in shape. The wafer chuck 20, or wafer support, may be on top of the base 18, circular in shape, and connected to the base 18 to rotate about a central axis thereof. The wafer chuck 20 may have an upper surface, which although not shown in detail, is substantially flat and in a plane to support a semiconductor wafer. Although not shown, it should be understood that the base 18 may include an electric motor, or other actuator, to rotate the wafer chuck 20 about the central axis thereof, along with a semiconductor wafer supported by the wafer chuck 20. The catch cup 22 may substantially be an annular, ring-shaped body attached to the top of the base 18, which tapers towards the central axis of the wafer chuck 20 the further the catch cup 22 extends from the base 18.

Figure 3:
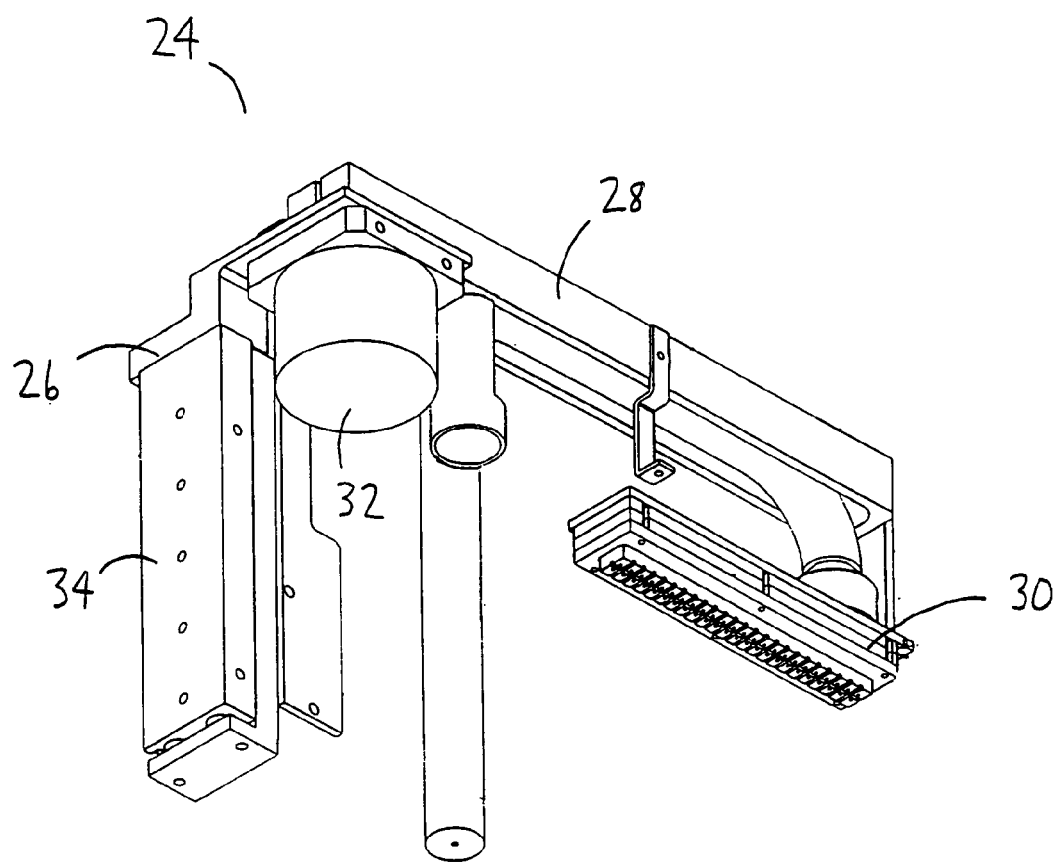
FIG. 3 is a bottom perspective view of the dispense arm, including a dispense head.

FIG. 3 illustrates the dispense arm 24. The dispense arm 24 may include a vertical piece 26, a horizontal piece 28, and a dispense head 30. As illustrated in FIGS. 2 and 3, the vertical piece 26 may be vertically attached to the base 18, and the horizontal piece 28 may be attached to the vertical piece 26 at a first end thereof so that it may translate transverse to the plane of the wafer chuck 20 and rotate over the wafer chuck 20. The dispense head 30 may be attached to a second end of the horizontal piece 28.

As illustrated in FIG. 3, the vertical piece 26 may include a rotational actuator 32 and a vertical actuator 34. The rotational actuator 32 may be an electric motor, or other such suitable actuator, which is connected to the dispense arm 24 to rotate the horizontal piece 28 and the dispense head 30 back and forth over the wafer chuck 20. The vertical actuator 34 may be a pneumatic actuator, or other such suitable actuator, which is connected to the base 18 and the horizontal piece 28 to translate the horizontal piece 28 transverse to the plane of the wafer chuck 20.

FIGS. 4a–4f illustrate the dispense head 30 suspended over the wafer chuck 20. The dispense head 30 may include a bottom piece 36, a sidewall 38, a top piece 40, and a channel 42 therein. Although only shown in cross-section, it should be understood, as illustrated in FIG. 3, that the dispense head 30 and all its components may have a substantially rectangular shape and may have a dimension, such as length, that may correspond to a radius of a semiconductor wafer. The dispense head 30 may further include a plurality of nozzles 44.

The bottom piece 36 may have a substantially flat upper surface 46 and include a plurality of nozzle openings 48 therethrough. The upper surface 46 of the bottom piece 36 may form a bottom of the channel 42. Each of the nozzles 44 may be held within a respective nozzle opening 48 and may have an outlet opening 50 at an upper end thereof. The outlet openings 50 may be at an outlet height 52 above the upper surface 46 of the bottom piece 36. The nozzles 44 may have a diameter 54, for example, of between 0.02 and 0.04 inch.

The sidewall 38 may be attached to a periphery of the bottom piece 36 and extend upwards therefrom. A portion of the sidewall 38 may have a drain opening 56 therethrough. The drain opening 56 may be adjacent to the upper surface 46 of the bottom piece 36. The drain opening 56 may have a drain height 58, which may be less than the outlet height 52 above the upper surface 46 of the bottom piece 36. In the embodiment shown, because the drain opening 56 is adjacent to the upper surface 46 of the bottom piece 36, the drain height 58 corresponds to a diameter of the drain opening 56. It should be understood the drain opening 58 does not have to be adjacent to the upper surface 46 of the bottom piece. The drain height 58, or the diameter of the drain opening 56, may be, for example, at least between 0.10 and 0.20 inch.

The top piece 40 may be attached to an upper end of the sidewall 38 and lie directly over the bottom piece 36. The top piece 40 may have an inlet opening 60 therethrough. The inlet opening 60 may be at an inlet height 62 above the upper surface 46 of the bottom piece 36, which may be greater than the outlet height 52. The inlet opening 60 may have a diameter 64 of, for example, between 0.10 and 0.30 inch. The inlet height 62 may be greater than the outlet height 52.

The channel 42 may be a passageway within the dispense head 30 that interconnects the inlet opening 60, the outlet openings 50, and the drain opening 56.

Although not illustrated in detail in the previous figures, the developer module 14 may further include an inlet valve 66, an outlet valve 68, and a pump 70. The pump 70 may have a low pressure side and a high pressure side. The inlet valve 66 may be connected to the inlet opening 60 through a supply line 71. The outlet valve 68 may be connected to the drain opening 56 through a drain line 73 on one side thereof and the low pressure side of the pump 70 on the other side thereof.

Figure 4A:
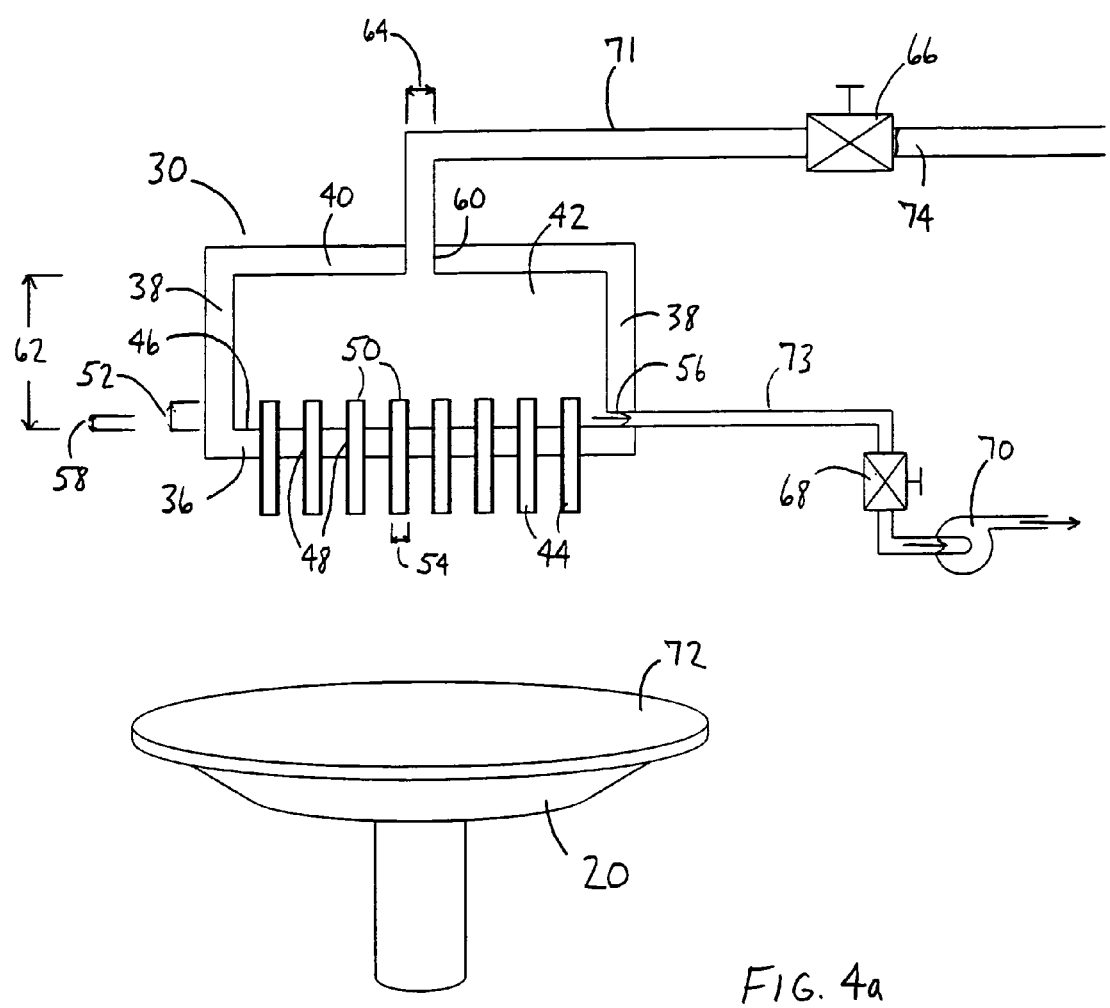
FIGS. 4a–4f are cross-sectional schematic views of the dispense head suspended over a semiconductor wafer.

In use, as illustrated in FIGS. 2 and 4a, a semiconductor substrate, such as a wafer 72, which may have a diameter, for example, of 200 or 300 mm, may be placed on the wafer chuck 20 of the developer module 14. The computer controller 16 may control the rotational actuator 32 and the vertical actuator 34 to move the dispense arm 24.

The vertical actuator 34 may lift the dispense arm 24 to a height sufficient for the dispense head 30 to clear an upper edge of the catch cup 22. The rotational actuator 32 may then rotate the dispense arm 24 so that the dispense head 30 is suspended above the semiconductor wafer 72 as illustrated in FIG. 4a.

Figure 4B:
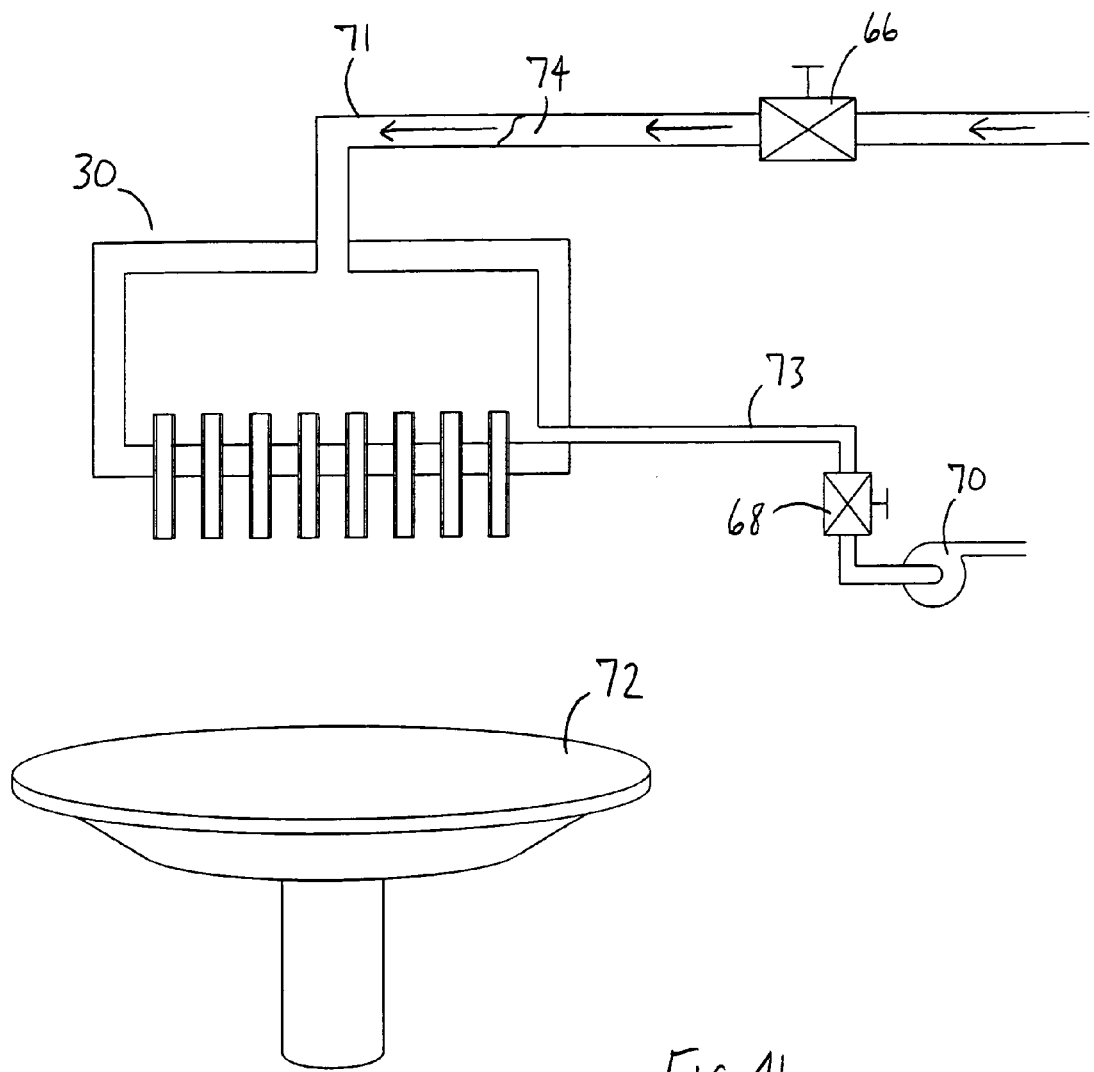

As shown in FIG. 4a, a liquid 74, such as a photoresist developer solvent, deionized water, or other such semiconductor processing liquid, may be supplied to the inlet valve 66. In the "normal" state, the inlet valve 66 is closed and the outlet valve 68 is open. Since the low pressure side of the pump is connected to the channel 42 and the outlet valve 68 is open, a negative air pressure exits within the channel 42. The computer controller 16 may then control the valves 66 and 68 to deposit the liquid 74 onto the semiconductor wafer 72. As illustrated in FIG. 4b, the computer controller 16 may open the inlet valve 66 and at the same time, close the outlet valve 68, allowing the liquid 74 to flow down the supply line 71.

Figure 4C:
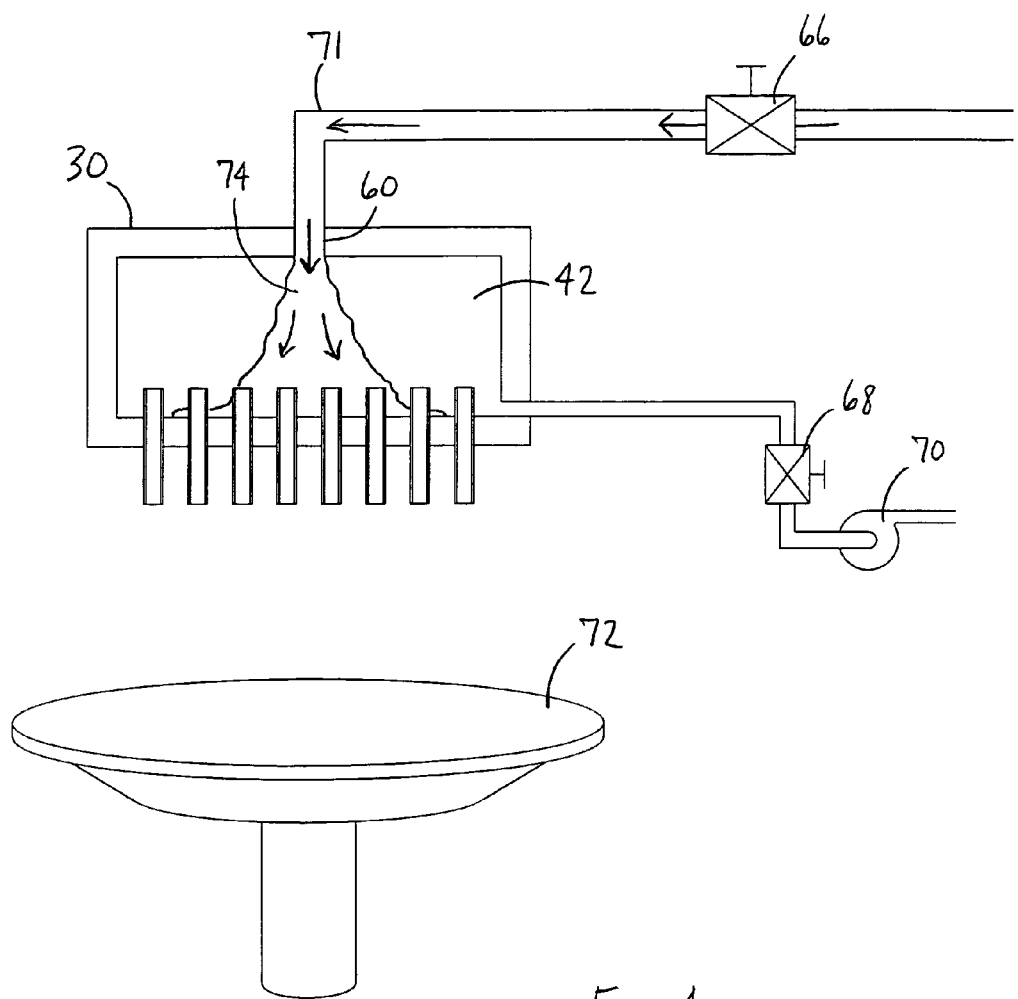

As illustrated in FIG. 4c, the liquid 74 may flow through the inlet valve 66, the supply line 71, and the inlet opening 60 and into the channel 42 of the dispense head 30. The liquid 74 may then begin to fill the channel 42.

Figure 4D:
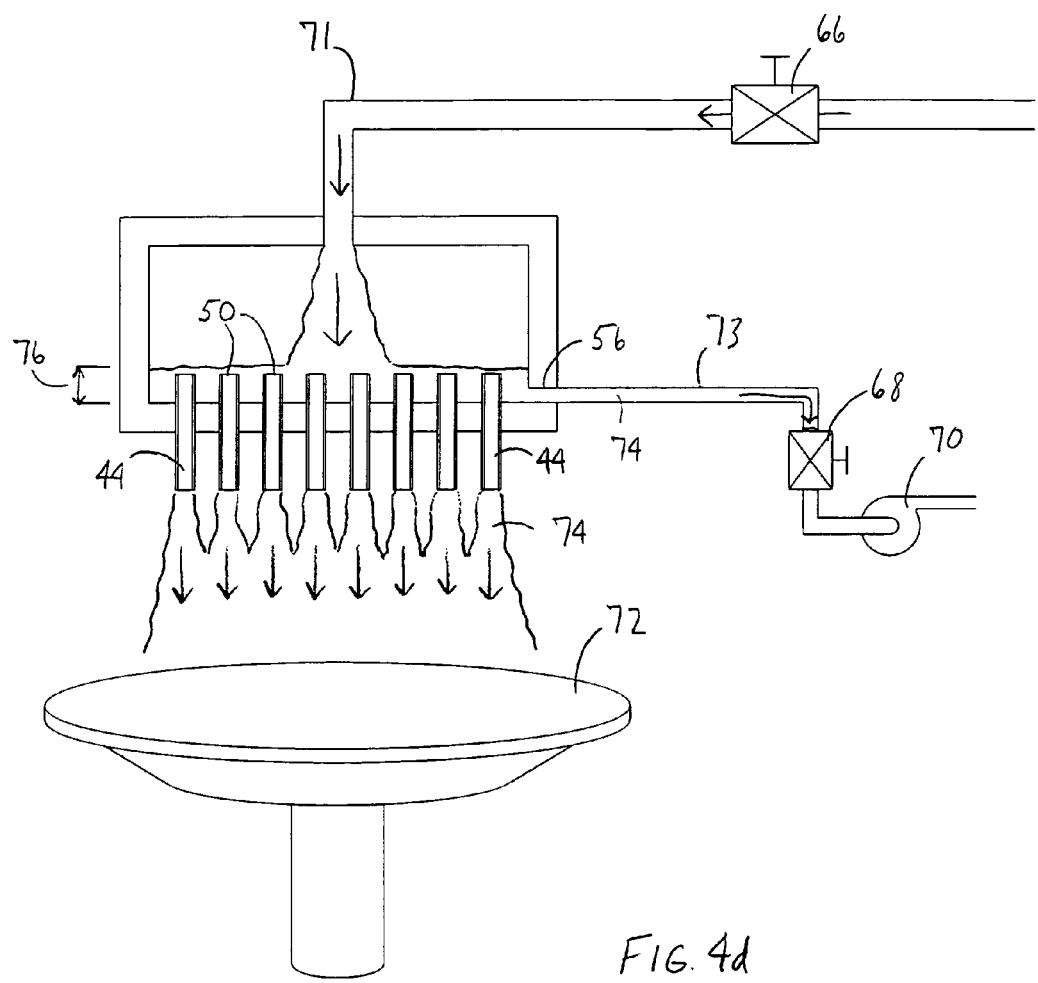

Referring to FIG. 4d, some of the liquid 74 may pass through the drain opening 56 and into the drain line 73, however, because the outlet valve 68 is closed, none of the liquid 74 is able to pass through the outlet valve 68. Therefore, a depth 76 of the liquid continues to rise within the channel 42 of the dispense head 30. When the depth 76 of the liquid 74 is greater than the outlet height 52, the liquid 74 flows downward through the outlet openings 50, through the nozzles 44, and onto the semiconductor wafer 72.

Figure 4E:
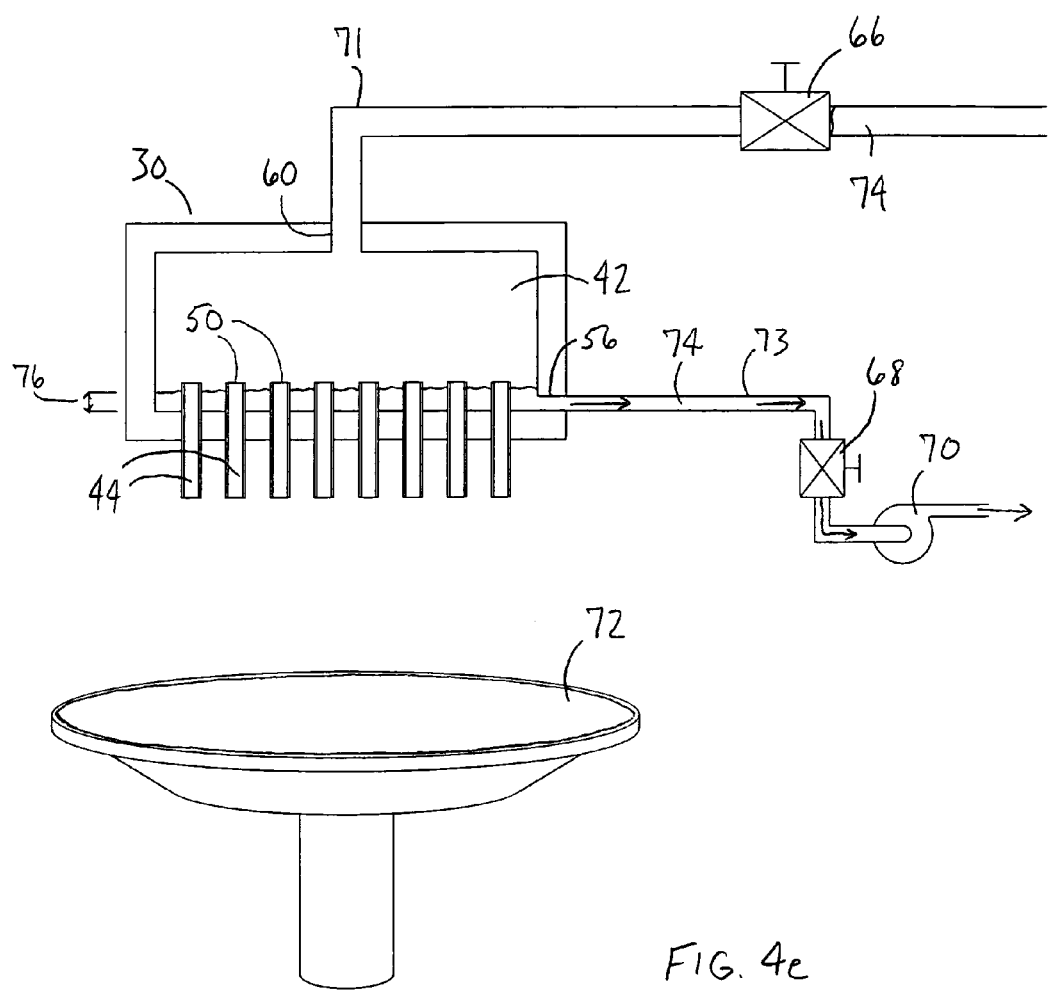

Referring to FIG. 4e, when an appropriate amount of liquid 74, such as 60 cubic centimeters, is deposited onto the semiconductor wafer 72, the computer controller 16 may restore the valves 66 and 68 to the normal state. The inlet valve 66 may close so that no more liquid may pass therethrough, and the outlet valve 68 may open. Since the channel 42 of the dispense head 30 is now connected to the low pressure side of the pump, the remaining liquid 74 in the channel 42 may be sucked from the channel 42 through the drain opening 56, the drain line 73, the outlet valve 68, and the pump 70. Once the depth 76 is below the outlet height 52, all liquid 74 remaining in the channel 42 exits the channel 42 through the drain opening 56. Although not illustrated, it should be understood that the liquid 74 may then be either disposed of or recycled to be used on a subsequent semiconductor wafer.

Figure 4F:
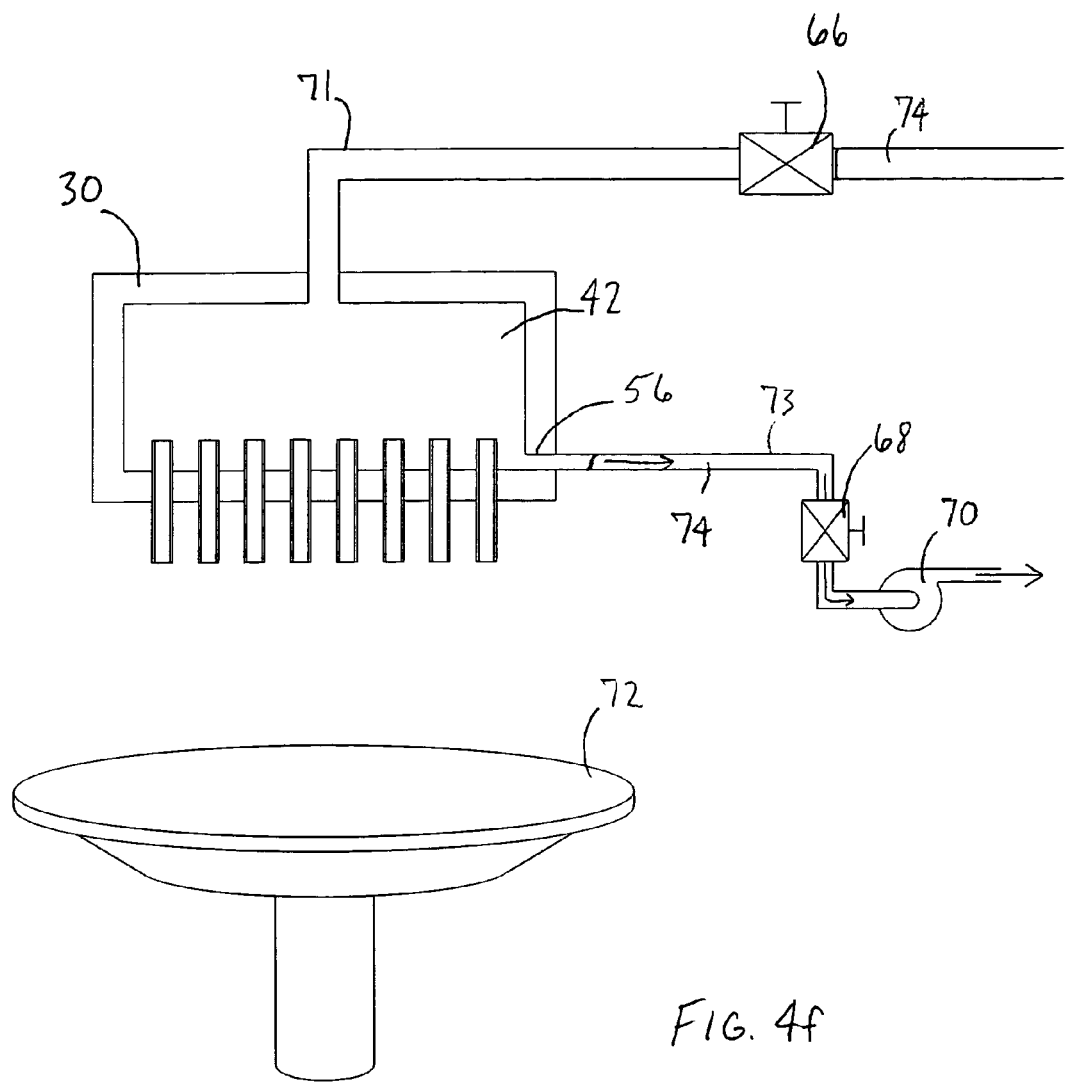

As illustrated in FIG. 4f, the vacuum effect of the pump 70 removes any solvent 74 remaining in the channel when the valves 66 and 68 are in the normal state.

One advantage is that because of the vacuum effect of the pump 70 when the valves are in the normal state, any solvents remaining in the channel is evacuated from the channel 42 through the drain opening 56 and not the nozzles 44. Therefore, no unwanted solvent is accidentally leaked or dripped onto the semiconductor wafer or another portion of the developer module. Another advantage is that because of the use of the pump 70 on an opposing side of the dispense head 30 there is no need for a suck-back valve.

Other embodiments may not use the pump to draw the remaining liquid from the channel but rely on the force of gravity and capillary action to drain the remaining liquid. Embodiments utilizing the pump may not have an outlet height that is less than the inlet height and greater than the drain height. Even though the dispense head as illustrated has only having one channel therethough, it should be noted that the dispense head may have multiple channels with separate inlets, outlets, and drains so that different types of solvents may be simultaneously dispensed from a single dispense head without the solvents mixing within the dispense head.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A system comprising:
a dispense head having a passageway therethrough, an inlet opening, at least one outlet opening, and a drain opening, the passageway interconnecting the inlet opening, the at least one outlet opening, and the drain opening;
a first valve connected to the inlet opening; and
a second valve connected to the drain opening, a fluid flowing into the inlet opening, through the passageway, and out of the at least one outlet opening when the first valve is open and the second valve is closed, the fluid flowing from the passageway out of the drain opening when the first valve is closed and the second valve is open, the drain opening is at a height less than the height at which the at least one outlet opening is located relative to a bottom of the passageway.

2. The system of claim 1, wherein the passageway has a bottom, the inlet opening is at a first height above the bottom of the passageway, the at least one outlet opening is at a second height above the bottom of the passageway, the second height being less than the first height, and the drain opening is at a third height above the bottom of the passageway, the third height being less than the second height.

3. The system of claim 2, wherein no fluid flows from the passageway out of the outlet opening when the first valve is closed and the second valve is open.

4. The system of claim 3, wherein the drain opening has a diameter of at least 0.10 inch.

5. The system of claim 4, wherein the drain opening is adjacent to the bottom of the passageway.

6. The system of claim 5, further comprising a pump having a low pressure side and a high pressure side, the low pressure side being connected to the second valve.

7. The system of claim 6, further comprising:
a frame; and
a substrate support attached to the frame to support a semiconductor substrate, the dispense head being connected to the frame and suspended in a selected position relative to the substrate.

8. The system of claim 7, wherein when the first valve is open and the second valve is closed, the fluid flows into the inlet opening, through the passageway, out of the at least one outlet opening, and onto the semiconductor substrate.

9. The system of claim 8, wherein the fluid is a semiconductor processing liquid.

10. The system of claim 9, wherein the dispenser head is moveable relative to the substrate support.

11. A system comprising:
a dispense head having a passageway therethrough, an inlet opening, at least one outlet opening, and a drain opening, the passageway interconnecting the inlet opening, the at least one outlet opening, and the drain opening;
a first valve connected to the inlet opening;
a second valve connected to the drain opening; and
a pump having a low pressure side and a high pressure side, the low pressure side being connected to the second valve, a fluid flowing into the inlet opening, through the passageway, and out of the at least one outlet opening when the first valve is open and the second valve is closed, the fluid flowing from the passageway only out of the drain opening when the first valve is closed and the second valve is open, the drain opening is at a height less than the height at which the at least one outlet opening is located relative to a bottom of the passageway.

12. The system of claim 11, wherein no fluid flows from the passageway out of the outlet opening when the first valve is closed and the second valve is open.

13. The system of claim 12, wherein the drain opening is adjacent to the bottom of the passageway.

14. The system of claim 13, further comprising:
a frame; and
a substrate support attached to the frame to support a semiconductor substrate, the dispense head being connected to the frame and suspended in a selected position relative to the substrate.

15. The system of claim 14, wherein when the first valve is open and the second valve is closed, the fluid flows into the inlet opening, through the passageway, out of the at least one outlet opening, and onto the semiconductor substrate.

16. A semiconductor substrate processing apparatus comprising:
a frame;
a substrate support attached to the frame to support a semiconductor substrate;
a dispenser head moveably connected to the frame and suspended in a selected position relative to the semiconductor substrate, the dispenser head having a bottom piece, an inlet opening at a first height above the bottom piece, at least one outlet opening at a second height above the bottom piece, the second height being less than the first height, a drain opening at a third height above the bottom piece, the third height being less than the second height, and a passageway therethrough interconnecting the inlet opening, the at least one outlet opening, and the drain opening;
a first valve connected to the inlet opening; and
a second valve connected to the drain opening, a fluid flowing into the inlet opening, through the passageway, and out of the outlet opening when the first valve is open and the second valve is closed, the fluid flowing from the passageway out of the drain opening when the first valve is closed and the second valve is open.

17. The semiconductor substrate processing apparatus of claim 16, wherein when the first valve is open and the second valve is closed, the fluid flows into the inlet opening, through the passageway, out of the at least one outlet opening, and onto the semiconductor substrate.

18. The semiconductor substrate processing apparatus of claim 17, wherein no fluid flows from the passageway out of the outlet opening when the first valve is closed and the second valve is open.

19. The semiconductor substrate processing apparatus of claim 18, wherein the dispenser head is suspended over the semiconductor substrate.

20. The semiconductor substrate processing apparatus of claim 19, wherein the drain opening has a diameter of at least 0.10 inches.

21. A semiconductor substrate processing apparatus comprising:
a frame;

a substrate support attached to the frame to support a semiconductor substrate;

a dispenser head connected to the frame and suspended over the semiconductor substrate, the dispenser head having a bottom piece, an inlet opening at a first height above the bottom piece, a plurality of outlet openings at a second height above the bottom piece, the second height being less than the first height, a plurality of nozzles, each being connected to a respective outlet opening, a drain opening at a third height above the bottom piece, the third height being less than the second height, and a passageway therethrough interconnecting the inlet opening, the plurality of outlet openings, and the drain opening;

a first valve connected to the inlet opening;

a second valve connected to the drain opening; and a pump having a low pressure side and a high pressure side, the low pressure side being connected to the second valve, a fluid flowing into the inlet opening, through the passageway and the plurality of outlet openings, out of the plurality of nozzles and onto the semiconductor wafer when the first valve is open and the second valve is closed, the fluid from the passageway out of the drain opening and no fluid flowing from the passageway out of the plurality of nozzles when the first valve is closed and the second valve is open.

* * * * *